(12) United States Patent
Cheng et al.

(10) Patent No.: US 8,570,747 B2
(45) Date of Patent: Oct. 29, 2013

(54) CARBON LAMINATED ENCLOSURE

(75) Inventors: Chao-Wen Cheng, Taipei (TW); Mark H Ruch, The Woodlands, TX (US); Mark S Tracy, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 237 days.

(21) Appl. No.: 13/132,119

(22) PCT Filed: Dec. 4, 2008

(86) PCT No.: PCT/US2008/085534
§ 371 (c)(1),
(2), (4) Date: Jun. 1, 2011

(87) PCT Pub. No.: WO2010/065035
PCT Pub. Date: Jun. 10, 2010

(65) Prior Publication Data
US 2011/0235255 A1 Sep. 29, 2011

(51) Int. Cl.
*H05K 7/20* (2006.01)
(52) U.S. Cl.
USPC .......... 361/714; 361/679.46; 361/679.54; 361/688; 361/704; 165/104.33; 165/185; 174/50; 174/520
(58) Field of Classification Search
USPC .......... 361/679.01, 679.02, 679.46, 679.54, 361/679.55, 688, 689, 704–710, 714, 816, 361/818; 165/80.3, 104.33, 185; 174/16.3, 174/50, 51, 520; 312/223.2, 223.3, 236
See application file for complete search history.

(56) References Cited

U.S. PATENT DOCUMENTS

| | | | |
|---|---|---|---|
| 3,427,706 A | | 2/1969 | Jaffee |
| 4,227,037 A | * | 10/1980 | Layton .................. 174/386 |
| 5,418,685 A | | 5/1995 | Hussmann et al. |
| 5,566,055 A | * | 10/1996 | Salvi, Jr. ................ 361/816 |
| 5,827,585 A | * | 10/1998 | Giannetti .............. 428/362 |
| 6,075,701 A | | 6/2000 | Ali et al. |
| 6,147,301 A | | 11/2000 | Bhatia |
| 6,365,076 B1 | | 4/2002 | Bhatia |
| 6,487,073 B2 | | 11/2002 | McCullough et al. |
| 6,514,616 B1 | | 2/2003 | Gandi et al. |
| 6,569,380 B2 | | 5/2003 | Lim et al. |
| 6,831,835 B2 | | 12/2004 | Soto |
| 7,161,809 B2 | * | 1/2007 | Ford et al. ............. 361/719 |
| 7,311,140 B2 | | 12/2007 | McCullough |

(Continued)

FOREIGN PATENT DOCUMENTS

| | | | | |
|---|---|---|---|---|
| EP | 1 070 738 A1 | | 1/2001 | |
| GB | 2144138 A | * | 2/1985 | .............. C08L 33/04 |

(Continued)

OTHER PUBLICATIONS

Cheng, Chao-Wen, et al., "Notification of Transmittal of the International Search Report and the Written Opinion of the International Searching Authority, or the Declaration," dated Jun. 30, 2009; cited in PCT Priority Appln. Serial No. PCT/US2008/085535 filed Apr. 12, 2008.

*Primary Examiner* — Michail V Datskovskiy

(57) ABSTRACT

An enclosure is provided. A housing (120) can have one or more walls (130). At least one of the one or more walls (130) can include a thermally conductive, carbonaceous member (100). The thermally conductive, carbonaceous member (100) can be partially or completely encapsulated within one or more electrically non-conductive materials.

7 Claims, 3 Drawing Sheets

(56) References Cited

U.S. PATENT DOCUMENTS

| | | |
|---|---|---|
| 7,393,587 B2 | 7/2008 | Krassowski et al. |
| 7,486,517 B2 * | 2/2009 | Aapro et al. ............... 361/714 |
| 8,324,515 B2 * | 12/2012 | Stevenson et al. ........... 174/565 |
| 2004/0071970 A1 * | 4/2004 | Kahl et al. ................ 428/411.1 |
| 2005/0142317 A1 * | 6/2005 | Clovesko et al. ............ 428/40.1 |
| 2006/0056157 A1 * | 3/2006 | Ford et al. ................... 361/704 |
| 2006/0077776 A1 * | 4/2006 | Matsushima et al. ...... 369/30.27 |
| 2007/0263352 A1 * | 11/2007 | Jones et al. ................. 361/688 |
| 2008/0057265 A1 | 3/2008 | Liang et al. |
| 2008/0217339 A1 * | 9/2008 | Arn .............................. 220/484 |

FOREIGN PATENT DOCUMENTS

| | | | | |
|---|---|---|---|---|
| JP | 1983059225 | | 4/1983 | |
| JP | 07060777 A | * | 3/1995 | ............. B29C 45/00 |
| JP | 2003012939 A | * | 1/2003 | ................ C08J 5/00 |
| JP | 2003133492 A | | 5/2003 | |

* cited by examiner

CARBON LAMINATED ENCLOSURE

BACKGROUND OF THE INVENTION

1. Field of the Invention

Embodiments of the present invention generally relate to housings for electrical devices. More particularly, embodiments of the present invention relate to electrical device housings incorporating a thermally conductive carbonaceous layer.

2. Description of the Related Art

Electronic devices are frequently mounted or otherwise disposed in a housing to protect components and provide a more robust user interface. To maximize portability and minimize cost, housings are often sized with little additional, i.e. unused, space within the housing. While cooling systems, for example fans or liquid cooling systems, are often employed to maintain a suitable thermal profile within the housing for the electronic components, the heat generated by the electronic components often results in the housing itself having an elevated temperature. At times, the elevated housing temperature can make the device uncomfortable to the touch, particularly in areas of the housing proximate the heat generating electronic components. Where the housing is deployed proximate the user, for example a laptop sitting on a user's legs, such heating can have numerous undesirable effects, such as an inability for the user to maintain proximity to the housing.

SUMMARY OF THE INVENTION

A housing apparatus is provided. The housing can have one or more walls. A thermally conductive, carbonaceous member can be disposed in, on, or about at least one of the walls forming the housing. The thermally conductive, carbonaceous member can be partially or completely encapsulated within one or more electrically non-conductive materials forming the wall.

A method of manufacturing an enclosure apparatus is also provided. A thermally conductive, carbonaceous member can be partially or completely encapsulated within one or more electrically non-conductive materials thereby forming a laminate. A housing having one or more walls can be formed, where all or a portion of at least one of the one or more walls comprises the laminate.

A method of dispersing heat generated by an electrical device is also provided. One or more heat-generating electrical components can be disposed within a housing. The housing can include one or more walls where at least a portion of the one or more walls comprises one or more layers of a thermally conductive, carbonaceous member. The one or more layers of a thermally conductive, carbonaceous member can be partially or completely encapsulated within one or more electrically non-conductive materials. All or a portion of the heat generated by the electrical device can be dispersed across all or a portion of the one or more layers of a thermally conductive, carbonaceous member. All or a portion of the heat transmitted to the one or more layers of a thermally conductive, carbonaceous member can be rejected from an exterior face of the enclosure. The thermal density of the heat rejected from the exterior face of the enclosure can be substantially uniform across the one or more layers of a thermally conductive, carbonaceous member.

BRIEF DESCRIPTION OF THE DRAWINGS

Advantages of one or more disclosed embodiments may become apparent upon reading the following detailed description and upon reference to the drawings in which.

DETAILED DESCRIPTION

Figure 1:
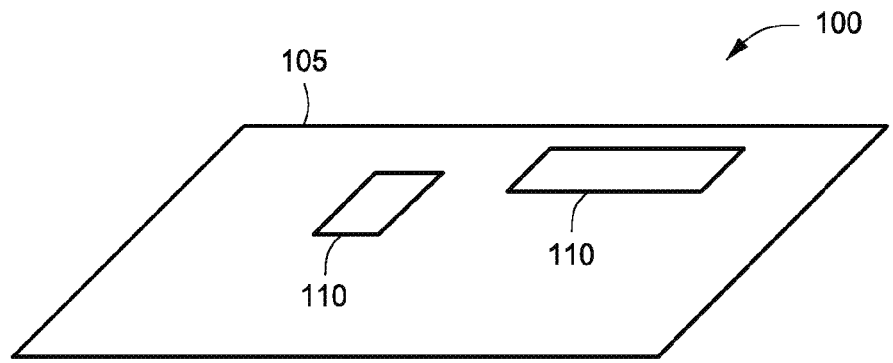
FIG. 1 is an isometric view depicting an illustrative thermally conductive carbonaceous member, according to one or more embodiments described herein.

FIG. 1 is an isometric view depicting an illustrative thermally conductive carbonaceous member 100, according to one or more embodiments. In one or more embodiments, the thermally conductive carbonaceous member 100 can include, but is not limited to a fabric, a foil, or a sheet. The thermally conductive carbonaceous member 100 can be flexible or rigid. In one or more embodiments, the thermally conductive, carbonaceous member 100 can include any carbon containing material having a high in-plane thermal conductivity and a relatively lower through-plane thermal conductivity. In one or more embodiments, the thermally conductive, carbonaceous member 100 can include, but is not limited to, one or more pure carbon materials, such as graphite or crystallized carbon. Crystallized carbon can include, but is not limited to crystalling structures such as buckminsterfullerene, in various geometric configurations such as nanotubes or spheres. In one or more embodiments, the thermally conductive, carbonaceous member 100 can include, but is not limited to, a substantially planar, carbonaceous sheet 105 as depicted in FIG. 1.

In one or more embodiments, one or more apertures 110 can be disposed in, on, or about the carbonaceous sheet 105. The one or more apertures 110 can have any physical size, shape, orientation, frequency, and/or configuration.

Figure 1A:
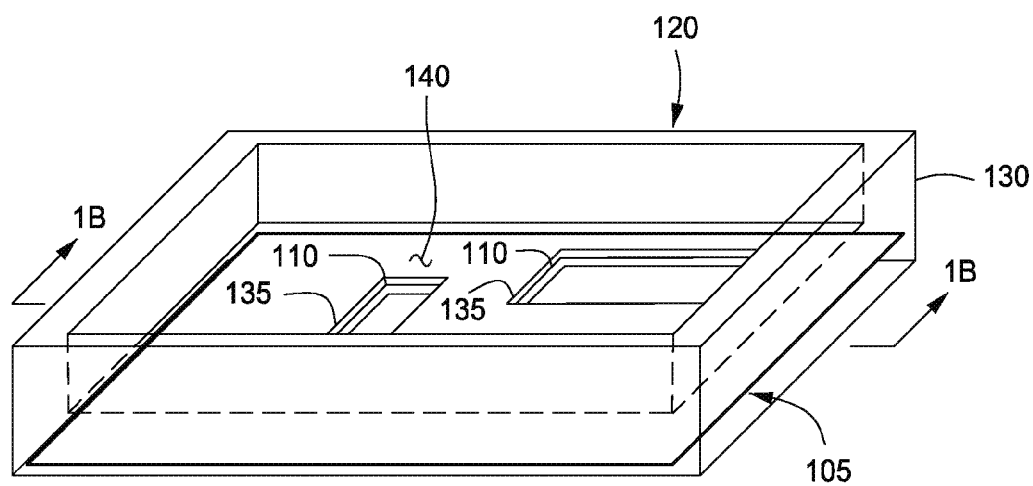
FIG. 1A is an isometric view depicting the illustrative thermally conductive carbonaceous member as depicted in FIG. 1 disposed in a wall of an exemplary housing, according to one or more embodiments described herein.
Figure 1B:
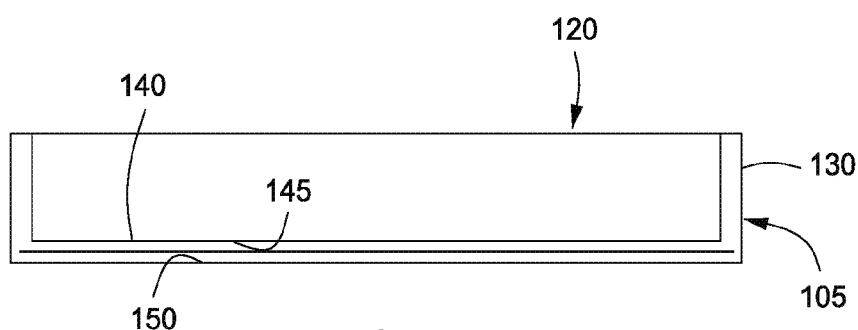
FIG. 1B is a cross-sectional view depicting the exemplary housing depicted in FIG. 1A, viewed along sectional line 1B-1B, according to one or more embodiments described herein.

FIG. 1A is an isometric view depicting the illustrative thermally conductive carbonaceous member 100 depicted in FIG. 1 disposed in a wall 130 of an exemplary housing 120, according to one or more embodiments. FIG. 1B is a cross-sectional view depicting the exemplary housing 120 depicted in FIG. 1A, viewed along sectional line 1B-1B, according to one or more embodiments. In one or more embodiments, the housing 120 can include one or more walls 130. In one or more specific embodiments, the one or more walls 130 can include, and in certain embodiments be proximate and attached to, one or more bottom surfaces 140. In one or more embodiments, as depicted in FIG. 1A, the one or more bottom surfaces 140 can be partially or completely disposed between the one or more walls 130. In one or more specific embodiments, the one or more walls 130 and the one or more bottom surfaces 140 can form a partially or completely open top housing 120 as depicted in FIG. 1A. In one or more embodiments, one or more holes or apertures 135 can be disposed in, on, or about the bottom surface 140 of the housing 120, for example, one or more apertures 135 suitable for the passage of one or more batteries, processors, memory, storage devices, and the like, could be disposed in, on, or about the bottom surface 140 of the housing 120.

In one or more specific embodiments, all or a portion of carbonaceous sheet 105 can be disposed in, on, or about all or a portion of the one or more walls 130 and or bottom surfaces 140 forming the housing 120. In one or more specific embodiments, all or a portion of the carbonaceous sheet 105 can be disposed within the bottom surface 140 of the housing 120.

In one or more embodiments, the carbonaceous sheet 105 can be partially or completely encapsulated by and disposed between an interior face 145 and an exterior face 150 of the bottom surface 140. In one or more embodiments, the carbonaceous sheet 105 can be partially or completely encapsulated on the interior face 145 of the bottom surface 140, and partially or completely exposed on all or a portion of the exterior face 150 of the bottom surface 140. In one or more embodiments, the carbonaceous sheet 105 can be partially or completely encapsulated on all or a portion of the exterior face 150 of the bottom surface 140, and partially or completely exposed on all or a portion of the interior face 145 of the bottom surface 140.

In one or more embodiments, one or more heat producing electronic devices can be partially or completely disposed in, on, or about the housing 120. In one or more embodiments, a computer motherboard; a computer daughterboard; a cellular telephone motherboard; a personal data assistant motherboard; a liquid crystal display ("LCD"); a plasma display; and a light emitting diode ("LED") display, or any combination thereof can be partially or completely disposed in, on, or about the enclosure 120.

Figure 2:
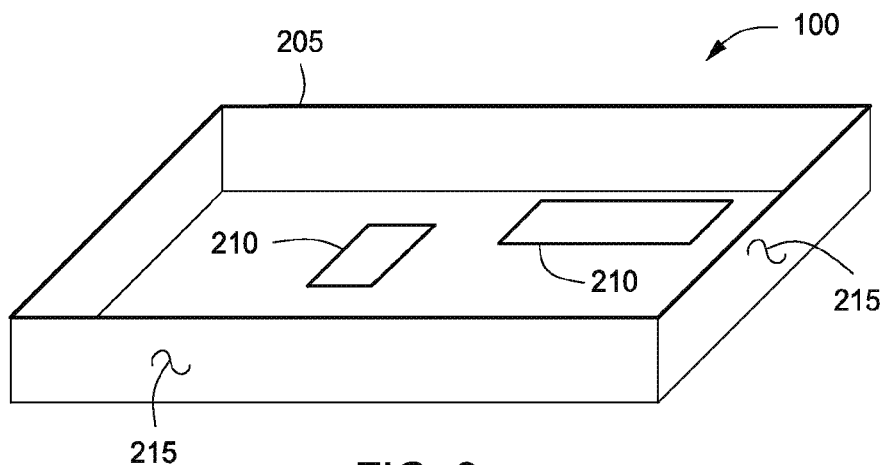
FIG. 2 is an isometric view depicting another illustrative thermally conductive carbonaceous member, according to one or more embodiments described herein.

FIG. 2 is an isometric view depicting another illustrative thermally conductive carbonaceous member 100, according to one or more embodiments. In one or more specific embodiments, the thermally conductive carbonaceous member 100 can include, but is not limited to a non-planar structure having multiple surfaces. In one or more embodiments, the thermally conductive, carbonaceous member 100 can include, but is not limited to a non-planar structure having one or more walls 215. In one or more embodiments, one or more of the one or more walls 215 can be disposed to provide a bottom surface 220, thereby forming an open-top, non-planar structure (a "carbonaceous box") 205 depicted in FIG. 2.

In one or more embodiments, one or more apertures 210 can be disposed in, on, or about the carbonaceous box 205. The one or more apertures 210 can have any physical size, shape, orientation, frequency, and/or configuration.

Figure 2A:
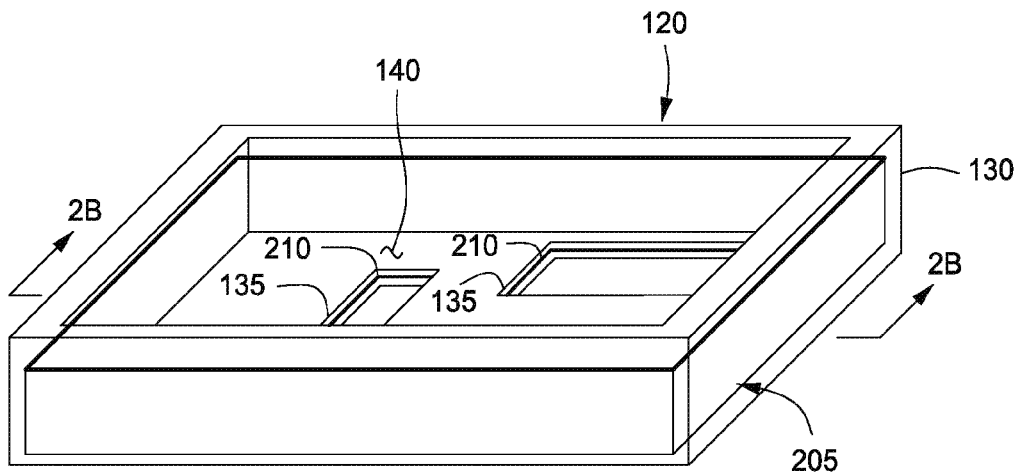
FIG. 2A is an isometric view depicting the illustrative thermally conductive carbonaceous member as depicted in FIG. 2 disposed in another exemplary housing, according to one or more embodiments described herein.
Figure 2B:
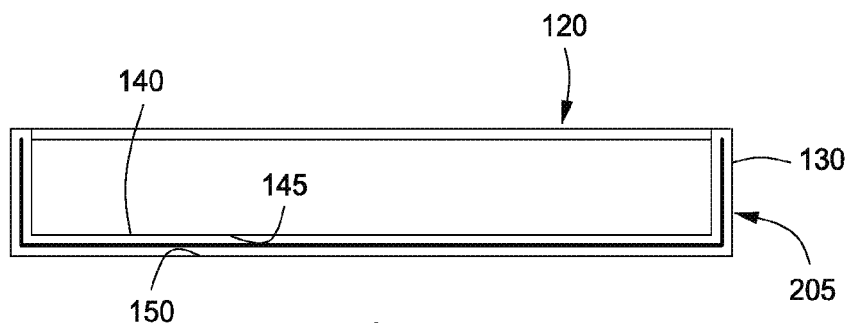
FIG. 2B is a cross-sectional view depicting the exemplary housing depicted in FIG. 2A, viewed along sectional line 2B-2B, according to one or more embodiments described herein.

FIG. 2A is an isometric view depicting the illustrative thermally conductive carbonaceous member 100 depicted in FIG. 2 disposed in an exemplary housing 120, according to one or more embodiments. FIG. 2B is a cross-sectional view depicting the exemplary housing 120 depicted in FIG. 2A, viewed along sectional line 2B-2B, according to one or more embodiments.

In one or more specific embodiments, all or a portion of the carbonaceous box 205 can be disposed in, on, or about all or a portion of the housing 120. In one or more embodiments, all or a portion of the carbonaceous box 205 can be partially or completely disposed within the bottom surface 140 and one or more walls 130 forming all or a portion of the housing 120. In one or more embodiments, one or more holes or apertures 135 can be disposed in, on, or about the bottom surface 130 of the housing 120, for example, one or more apertures 135 for batteries, processors, memory, and/or storage devices could be disposed on the bottom surface 130 of the housing 120. In one or more embodiments, one or more holes or apertures 135 can be disposed in one or more of the one or more walls 120 of the housing 120, for example, one or more holes and/or apertures 135 for I/O ports, cooling vents, switches, power connections, and the like.

In one or more specific embodiments, all or a portion of the carbonaceous box 205 can be disposed in, on, or about all or a portion of the one or more walls 130 and or bottom surfaces 140 forming the housing 120. In one or more specific embodiments, all or a portion of the carbonaceous box 205 can be disposed within the one or more walls 130 and the bottom surface 140 of the housing 120.

In one or more embodiments, the carbonaceous box 205 can be completely encapsulated and partially or completely disposed between an interior face 145 and an exterior face 150 of the bottom surface 140. In one or more embodiments, the carbonaceous box 205 can be partially or completely encapsulated on the interior face 145 of the bottom surface 140, and partially or completely exposed on all or a portion of the exterior face 150 of the bottom surface 140. In one or more embodiments, the carbonaceous box 205 can be partially or completely encapsulated on all or a portion of the exterior face 150 of the bottom surface 140, and partially or completely exposed on all or a portion of the interior face 145 of the bottom surface 140.

In one or more embodiments, the thermally conductive carbonaceous member 100 can be partially or completely disposed in, on, or about all or a portion of the one or more walls 130 and/or bottom surface 140 of the housing 120 using any molding or casting technique known in the industry. In one or more specific embodiments, the thermally conductive carbonaceous member 100 can be partially or completely disposed in, on, or about all or a portion of the one or more walls 130 and/or bottom surfaces 140 of the housing 120 using an insert mold technology, including a bi-injection mold technology or sandwich injection mold technology.

In one or more embodiments, the thermally conductive carbonaceous member 100 can be disposed in, on, or about the one or more walls 130 and/or bottom surface 140 of the housing 120 via insert molding. With insert molding, the thermally conductive carbonaceous member 100 can be disposed within a hollow mold that permits a gap or airspace to extend between all or a portion of the thermally conductive carbonaceous member 100 and the walls of the mold. One or more plastics, thermosetting polymers, cross-linking polymers, or the like can be introduced as a liquid under pressure to the gap or airspace surrounding all or a portion of the thermally conductive carbonaceous member 100. After permitting the plastic or polymer to set, the housing 110, with the partially or completely encapsulated thermally conductive carbonaceous member 100 disposed therein, can be removed from the mold.

In one or more embodiments, the thermally conductive carbon member 100 can be disposed in, on, or about the one or more walls 130 and/or bottom surface 140 of the housing 120 via in-mold rolling ("IMR"). With IMR, the thermally conductive carbonaceous member 100 and one or more molten plastic or similar polymers can be continuously or semi-continuously introduced to one or more sets of contact rollers. By passing both the thermally conductive carbonaceous member 100 and one or more molten plastic or similar polymers through the contact rollers, a finished laminate having the thermally conductive carbonaceous member 100 partially or completely encapsulated can be provided.

In one or more specific embodiments, all or a portion of the thermally conductive carbonaceous member 100 can be made from graphite using any suitable process known to the art. In one or more specific embodiments, the thermally conductive carbonaceous member 100 can be formed by compressing exfoliated graphite flakes in the absence of a binder. During compression, the exfoliated graphite flakes can expand along one or more planar axes one hundred times or more. The compression, experienced by the exfoliated graphite flakes impact can collide with each other, causes the exfoliated graphite flakes to crumple and deform, similar to an accordion. The frictional forces generated by the crumpling can lock, attach, or otherwise link the compressed graphite flakes to each other, thereby forming the carbonaceous sheet 105 without the use of binders.

The microstructure of the thermally conductive carbonaceous member 100 can have one or more layers, each layer containing a plurality of compressed graphite flakes. Such materials are available commercially, for example TIR600-10 High Performance Electric & Thermal Conductive Interface Material as manufactured and marketed by Thermazig, Ltd. (Newcastle, Del.). In one or more specific embodiments, the compressed graphite flakes forming one or more layers in the thermally conductive carbonaceous member 100 can be preferentially parallel to the upper and lower surfaces of the sheet. The configuration of graphite flakes within the thermally conductive carbonaceous member 100 can improve the electrical and thermal conductivity of the thermally conductive carbonaceous member 100 in a direction parallel to the longitudinal plane ("in-plane") of the thermally conductive carbonaceous member 100 while minimizing the electrical and thermal conductivity of the sheet in a direction perpendicular, or normal to the plane ("through-plane") of the thermally conductive carbonaceous member 100.

In one or more embodiments, the thickness of each layer forming the thermally conductive carbonaceous member 100 can range from about 0.01 mm to about 1 mm.; about 0.05 mm to about 0.8 mm; or about 0.08 mm to about 0.6 mm. In one or more embodiments, the thickness of the overall carbonaceous sheet 105 can range from about 0.01 mm to about 5 mm; about 0.1 mm to about 5 mm; or about 0.1 mm to about 3 mm. In one or more embodiments, the in-plane thermal conductivity of the thermally conductive carbonaceous member 100 can be a minimum of about 100 W/m-K or more; a minimum of about 150 W/m-K or more; a minimum of about 200 W/m-K or more; or a minimum of about 300 W/m-K or more. In one or more embodiments the through-plane thermal conductivity of the thermally conductive carbonaceous member 100 can be a maximum of about 200 W/m-K or less; a maximum of about 100 W/m-K or less; a maximum of about 50 W/m-K or less; or a maximum of about 25 W/m-K or less. In one or more embodiments, the thermal resistance of the carbonaceous sheet 105 can be a minimum of about 0.01 in$^2$-° C/W; a minimum of about 0.03 in$^2$-° C/W; a minimum of about 0.05 in$^2$-° C/W; or a minimum of about 0.07 in$^2$-° C/W. In one or more embodiments, the density of the thermally conductive carbonaceous member 100 can range from about 0.1 g/cm$^3$ to about 1.75 g/cm$^3$; about 0.25 g/cm$^3$ to about 1.5 g/cm$^3$; or about 0.5 g/cm$^3$ to about 1.25 g/cm$^3$.

In one or more embodiments, all or a portion of the thermally conductive carbonaceous member 100 can be made from crystalline carbon using any suitable process known to the art. In one or more specific embodiments, the carbonaceous sheet 105 can be formed from one or more layers of aligned or unaligned crystalline carbon nanotubes, commonly known as "buckytubes." In one or more embodiments, the carbon nanotubes can be formed into layers or plies using a deposition process whereby a plurality of crystalline carbon nanotube fibers are dispersed within a liquid solvent to form a solution or suspension. Removal of the liquid results in the formation of a crystalline carbon nanofiber film, commonly referred to as "buckypaper." In one or more embodiments, the carbon nanofibers can be unaligned in the film. In one or more embodiments, the carbon nanofibers can be aligned within the film, for example by separating the liquid from the nanotube solution in the presence of a high-strength magnetic field. In one or more embodiments, the thermally conductive carbonaceous member 100 can include one or more plies or layers, at least one of which can include a carbon nanotube film.

In one or more embodiments, the carbon nanotubes can include single wall nanotubes (SWNT), multi-wall nanotubes (MWNT), or any combination thereof. In one or more embodiments, the diameter of the carbon nanotubes can range from about 0.1 nm to about 1,000 nm; about 0.5 nm to about 500 nm; or about 1 nm to about 200 nm. In one or more embodiments, the molecular weight of each carbon nanotube can range from about 300 atomic mass units ("AMU") to about 100 million AMU; about 600 AMU to about 50 million AMU; or about 800 AMU to about 15 million AMU. In one or more embodiments, the carbon nanotubes can be supplied using any number of commercially available sources, for example carbon nanofibers supplied by Carbon Nanotechnologies, Inc. (Houston, Tex.). In one or more embodiments, each ply of the carbon nanotube film can have a thickness of from about 1 micron to about 500 microns; about 2 microns to about 200 microns; or about 5 microns to about 100 microns.

In one or more embodiments, all or a portion of the thermally conductive carbonaceous member 100 can be subjected to electromagnetic energy to alter one or more characteristics and/or physical properties of the sheet, including but not limited to, the strength, tensile strength, toughness, and/or strain resistance of the thermally conductive carbonaceous member 100. In one or more embodiments, the electromagnetic energy can be provided using one or more of the following: an electron beam; an ion particle beam; or a light beam operating in one or more spectrums including ultraviolet, visible and/or infrared.

In one or more embodiments, all or a portion of the thermally conductive carbonaceous member 100 can be mixed, combined, impregnated, coated, or otherwise exposed to one or more binders, fillers or adhesives. In one or more embodiments, the binder, filler, or adhesive can be thermally and/or electrically conductive. In one or more embodiments, the binder, filler, or adhesive can include one or more flowable thermo-setting or photo-setting materials, including, but not limited to, one or more thermoplastic polymers, one or more photosetting epoxies, one or more thermosetting epoxies, or any combination thereof.

In one or more embodiments, all or a portion of the thermally conductive carbonaceous member 100 can be partially or completely chemically modified or coated with one or more materials, for example, one or more metals. In one or more embodiments, one or more metals, including but not limited to, nickel, copper, silver, and gold can be plated, applied or otherwise disposed in, on, or about the thermally conductive carbonaceous member 100.

Figure 3A:
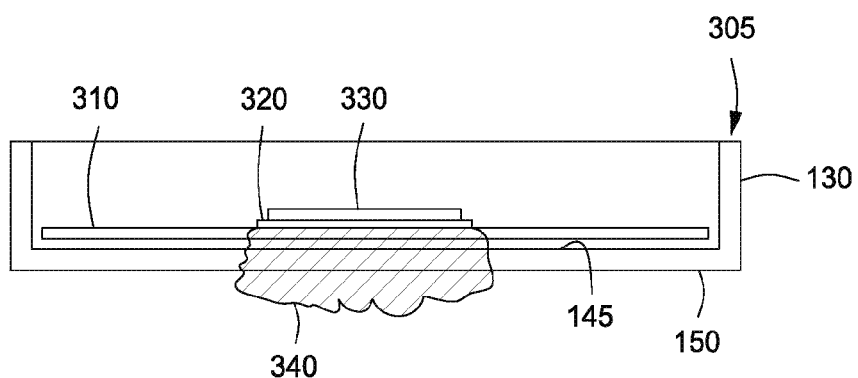
FIG. 3A is a schematic diagram depicting heat flow in an exemplary housing, according to one or more embodiments described herein.

FIG. 3A is a schematic diagram depicting typical heat flow 340 in an exemplary housing 305, according to one or more embodiments. In one or more embodiments, one or more circuit boards 310 can be disposed in, on, or about the housing 305. One or more sockets 320 having therein disposed one or more heat-generating electronic components 330 can be disposed in, on, or about the one or more circuit boards 310.

In operation, heat 340 can flow from the one or more heat-generating electronic components 330, increasing the temperature of the socket 320, one or more circuit boards 310, and the housing 305 proximate the one or more heat-generating electronic components 330. In one or more embodiments, the heat 340 flowing from the one or more heat-generating electronic components 330 can increase the temperature of the lower face 140 of the housing 305 proximate the one or more heat-generating electronic components 330 by about 10° C. or more above ambient temperature; about 20° C. or more above ambient temperature; about 30° C. or more above ambient temperature; about 40° C. or more above ambient temperature; or about 50° C. or more above ambient temperature.

Figure 3B:
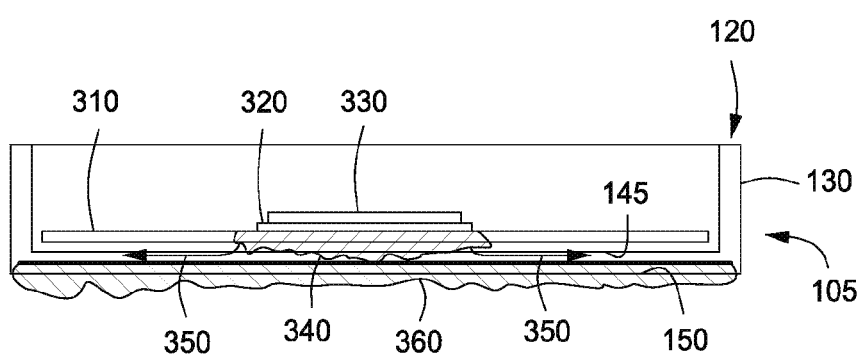
FIG. 3B is a schematic diagram depicting heat flow in the exemplary housing depicted in FIG. 1B, according to one or more embodiments described herein.

FIG. 3B is a schematic diagram depicting heat flow 340 in the exemplary housing 120 depicted in FIG. 1B, according to one or more embodiments. In one or more embodiments, one or more thermally conductive carbonaceous members 100 depicted in FIG. 1 can be partially or completely disposed in, on, or about all or a portion of the housing 120, for example a carbonaceous sheet 105 disposed in, on, or about the bottom surface 140 of the housing 120.

In operation, heat 340 can flow from the one or more heat-generating electronic components 330, increasing the temperature of the socket 320, one or more circuit boards 310, and the inner face 145 of the housing 120 proximate the one or more heat-generating electronic components 330. Heat 340 can flow through the housing and into the carbonaceous sheet 105 disposed within the housing 120. Since the carbonaceous sheet 105 preferentially transmits heat in-plane with, i.e. parallel to, the carbonaceous sheet 105, the heat 340 transmitted to the carbonaceous sheet 105 by the heat-generating electronic component 330 can be evenly or unevenly distributed throughout the extent of the carbonaceous sheet 105. By distributing the heat 350 more or less evenly throughout the carbonaceous sheet 105, the formation of high temperature "hot spots" on the enclosure 120 proximate the one or more heat-generating electronic components 330 can be minimized. Heat 350 can flow from the carbonaceous sheet 105, through the bottom surface 140 of the enclosure 120, exiting the enclosure via the lower face 150.

In one or more embodiments, the heat 350 flowing from the one or more carbonaceous sheet 105 can increase the temperature of the lower face 150 of the housing 305 by about 5° C. or more above ambient temperature; about 10° C. or more above ambient temperature; about 15° C. or more above ambient temperature; about 20° C. or more above ambient temperature; or about 25° C. or more above ambient temperature surrounding the enclosure 120.

Certain embodiments and features have been described using a set of numerical upper limits and a set of numerical lower limits. It should be appreciated that ranges from any lower limit to any upper limit are contemplated unless otherwise indicated. Certain lower limits, upper limits and ranges appear in one or more claims below. All numerical values are "about" or "approximately" the indicated value, and take into account experimental error and variations that would be expected by a person having ordinary skill in the art.

Various terms have been defined above. To the extent a term used in a claim is not defined above, it should be given the broadest definition persons in the pertinent art have given that term as reflected in at least one printed publication or issued patent. Furthermore, all patents, test procedures, and other documents cited in this application are fully incorporated by reference to the extent such disclosure is not inconsistent with this application and for all jurisdictions in which such incorporation is permitted.

While the foregoing is directed to embodiments of the present invention, other and further embodiments of the invention may be devised without departing from the basic scope thereof, and the scope thereof is determined by the claims that follow.

What is claimed is:

1. An apparatus comprising:
a housing having one or more walls;
wherein all or a portion of at least one of the one or more walls comprises one or more thermally conductive, carbonaceous members,
wherein all or a portion of the one or more thermally conductive carbonaceous members comprises a sheet of aggregated carbon nanotubes.

2. The apparatus of claim 1, wherein the one or more walls are arranged to form a partially or completely continuous peripheral wall having one or more surfaces disposed partially or continuously therebetween, wherein all or a portion of the one or more surfaces comprise the one or more thermally conductive carbonaceous members partially or completely encapsulated within one or more electrically non-conductive materials.

3. The apparatus of claim 1, further comprising;
disposed, in, on, or about the housing, an electronic device selected from the group consisting of: a computer motherboard; a computer daughterboard; a cellular telephone motherboard; a personal data assistant motherboard; a liquid crystal display; a plasma display; and a light emitting diode display.

4. The apparatus of claim 1, wherein an in-plane thermal conductivity of the one or more thermally conductive carbonaceous members is about 100 W/m-K or more; and, wherein a through-plane, or out-of-plane, thermal conductivity of the one or more thermally conductive carbonaceous members is less than about 100 W/m-K.

5. The enclosure apparatus of claim 1, wherein a thickness of the one or more thermally conductive carbonaceous members can have a range of from about 0.1 mm to about 5 mm.

6. The apparatus of claim 1, wherein a density of the one or more thermally conductive carbonaceous members can have a range of from about 0.25 g/cm$^3$ to about 1.5 g/cm$^3$.

7. A method for dispersing heat generated by electrical devices disposed partially or completely within a housing, comprising:
disposing one or more heat generating electrical components within a housing, the housing comprising:
one or more walls, wherein at least a portion of the one of the one or more walls comprises a thermally conductive, carbonaceous material;
wherein the thermally conductive, carbonaceous material is partially or completely encapsulated within one or more non-conductive materials;
dispersing all or a portion of heat generated by the one or more heat generating electrical components evenly or unevenly across the thermally conductive, carbonaceous material; and
rejecting all or a portion of the heat transmitted to the thermally conductive, carbonaceous material from an exterior face of the housing, wherein a density of the heat rejected is substantially uniform across the thermally conductive, carbonaceous material,
wherein the thermally conductive, carbonaceous material comprises a sheet of aggregated carbon nanotubes.

* * * * *

UNITED STATES PATENT AND TRADEMARK OFFICE
CERTIFICATE OF CORRECTION

| | | |
|---|---|---|
| PATENT NO. | : 8,570,747 B2 | Page 1 of 1 |
| APPLICATION NO. | : 13/132119 | |
| DATED | : October 29, 2013 | |
| INVENTOR(S) | : Chao-Wen Cheng et al. | |

It is certified that error appears in the above-identified patent and that said Letters Patent is hereby corrected as shown below:

In the Claims:

In column 8, line 26, in Claim 3, delete "comprising;" and insert -- comprising: --, therefor.

In column 8, line 39, in Claim 5, delete "The enclosure" and insert -- The --, therefor.

In column 8, line 50, in Claim 7, delete "of the" and insert -- of --, therefor.

Signed and Sealed this
Eleventh Day of February, 2014

Michelle K. Lee
*Deputy Director of the United States Patent and Trademark Office*